United States Patent
Li

(10) Patent No.: US 10,277,256 B2
(45) Date of Patent: Apr. 30, 2019

(54) DECODING ACROSS TRANSMISSION TIME INTERVALS

(71) Applicant: MEDIATEK INC., Hsin-Chu (TW)

(72) Inventor: Xiu-Sheng Li, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/392,488

(22) Filed: Dec. 28, 2016

(65) Prior Publication Data

US 2017/0194988 A1    Jul. 6, 2017

Related U.S. Application Data

(60) Provisional application No. 62/274,805, filed on Jan. 5, 2016.

(51) Int. Cl.
| | |
|---|---|
| *H03M 13/29* | (2006.01) |
| *H03M 13/11* | (2006.01) |
| *H03M 13/23* | (2006.01) |
| *H03M 13/25* | (2006.01) |

(52) U.S. Cl.
CPC .... *H03M 13/2906* (2013.01); *H03M 13/1102* (2013.01); *H03M 13/23* (2013.01); *H03M 13/258* (2013.01)

(58) Field of Classification Search
CPC .................................................. H03M 13/2957
USPC .................................. 714/755, 757, 752, 760
See application file for complete search history.

(56) References Cited

U.S. PATENT DOCUMENTS

| | | | | |
|---|---|---|---|---|
| 6,157,327 A | * | 12/2000 | Akaogi | G06T 9/005 |
| | | | | 341/67 |
| 2006/0195765 A1 | * | 8/2006 | Coffey | H03M 13/1105 |
| | | | | 714/760 |

* cited by examiner

*Primary Examiner* — Fritz Alphonse
(74) *Attorney, Agent, or Firm* — Oblon, McClelland, Maier & Neustadt, L.L.P.

(57) ABSTRACT

Aspects of the disclosure provide a method for accelerating a decoding process. The method includes receiving first bit reliability values (BRVs) of a first codeword corresponding to a first bit sequence of an information block, receiving second BRVs of a second codeword corresponding to a second bit sequence of the information block, aggregating respective first BRVs and second BRVs into an aggregated. BRV for each static code bit of the second codeword, and decoding the second codeword to recover the second bit sequence of the information block using the aggregated BRVs of each static code bit of the second codeword.

20 Claims, 11 Drawing Sheets

| | PARAMETER | #BITS | FREQUENTLY CHANGE? | |
|---|---|---|---|---|
| 422 | SFN | 4 | YES (CHANGE PER 640ms) | VARYING |
| 423 | H-SFN | 2 | YES (CHANGE PER 640ms*16) | SEMI-STATIC |
| 424 | SIB1 SCHEDULING INFO AND TBS | 4 | NO | STATIC |
| 425 | SYSTEM INFO VALUE TAG | 5 | NO | |
| 426 | ACCESS BARRING INFO | 1 | NO | |
| 427 | OPERATION MODE AND SAME-PCI INDICATION | 2 | NO | |
| 428 | OPERATION MODE DEPENDENT PARAMETERS | 5 | NO | |
| 429 | SPARE | 11 | NO | |
| 430 | CRC | 16 | YES (DUE TO CHANGE OF OTHERS) | VARYING |
| 431 | | TOTAL:50 | | |

*FIG. 4*

| PARAMETER | #BITS | FREQUENTLY CHANGE? | |
|---|---|---|---|
| DL-BANDWIDTH | 3 | NO | STATIC |
| PHICH-CONFIG | 3 | NO | STATIC |
| SFN | 8 | YES (CHANGE PER 40ms) | VARYING |
| SPARE | 10 | NO | STATIC |
| CRC | 16 | YES (DUE TO CHANGE OF OTHERS) | VARYING |
| TOTAL: 40 | | | |

FIG. 6

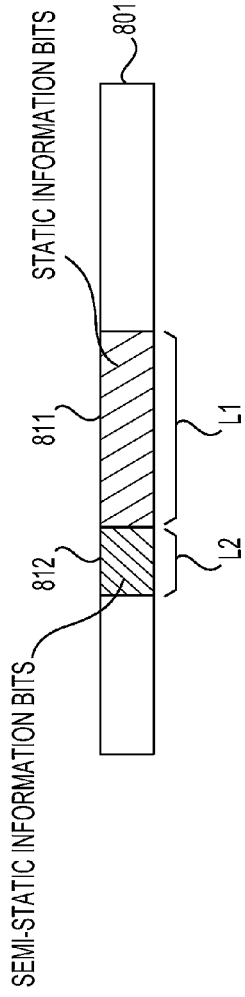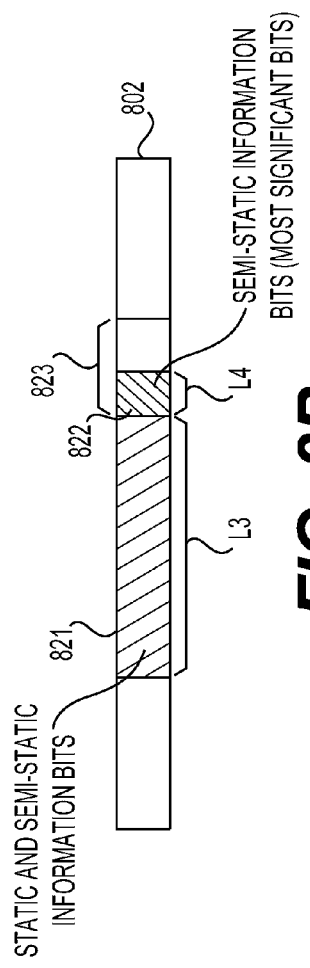
FIG. 8A
FIG. 8B

DECODING ACROSS TRANSMISSION TIME INTERVALS

INCORPORATION BY REFERENCE

This present disclosure claims the benefit of U.S. Provisional Application No. 62/274,805, "PBCH Enhancement in Narrow Band Internet of Thing" filed on Jan. 5, 2016, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Narrow Band Internet of Things (NB-IoT) technology aims at providing wireless connectivity to a massive number of devices. During an initial stage for gaining access to an NB-IoT network, a device, such as a utility meter, may perform a decoding process in order to acquire system information of the NB-IoT network, such as a Master Information Block (MIB). When condition of the wireless channel for transmitting the system information is poor, the decoding process may be performed repeatedly, undesirably increasing power consumption of the device.

SUMMARY

Aspects of the disclosure provide a method for accelerating a decoding process. The method can include receiving first bit reliability values (BRVs) of a first codeword corresponding to a first bit sequence of an information block, receiving second BRVs of a second codeword corresponding to a second bit sequence of the information block, aggregating respective first BRVs and second BRVs into an aggregated BRV for each static code bit of the second codeword, and decoding the second codeword to recover the second bit sequence of the information block using the aggregated BRVs of each static code bit of the second codeword.

In one example, the information block includes static information bits that do not change for different transmission time intervals (TTIs) of the information block, and the static code bits of the second codeword are generated from the static information bits of the information block through an encoding process.

In another example, the information block includes, in a static information section, static information bits that do not change for different TTIs of the information block, and semi-static information bits that do not change for at least two TTIs of the information block. Accordingly, the static code bits of the second codeword are generated from the static information bits and the semi-static information bits of the information block through an encoding process. In addition, in a further example, the semi-static information bits include one or more significant bits (MSBs) of a data field of the information block. The one or more MSBs are attached at the end of the static information section of the information block.

Embodiments of the method can further include calculating, at a demodulator, a log likelihood ratio (LLR) for each code bit in the first or second codewords to be the BRVs. The LLR is a logarithm value of ratio of probability of a transmitted code bit being a first binary symbol to that of the transmitted code hit being another binary symbol.

In one embodiment, the first and second codewords are ones of block codes, convolutional codes, turbo codes, and low-density parity-check (LDPC) codes. In one example, the first and second codewords are tail biting convolutional codes (TBCCs). In another embodiment, the information block is a Master Information Block (MIB) specified in 3GPP LIE standards or 3GPP NB-IoT standards.

Aspects of the disclosure provide a method for reordering data fields of an information block. The method can include reordering data fields of an information block such that at least two previously separate data fields are adjacent to each other to form a static information section in the information block with respect to a transmission time interval (TTI) of transmitting the information block, and encoding the reordered information block to generate a codeword including static code bits generated from information bits in the static information section of the information block.

Aspects of the disclosure provide a decoder for accelerating a decoding process. The decoder can include circuitry configured to receive first bit reliability values (BRVs) of a first codeword corresponding to a first bit sequence of an information block, receive second BRVs of a second codeword corresponding to a second bit sequence of the information block, aggregate respective first BRVs and second BRVs into an aggregated BRV for each static code bit of the second codeword, and decode the second codeword to recover the second bit sequence of the information block using the aggregated BRVs of each static code bit of the second codeword.

BRIEF DESCRIPTION OF THE DRAWINGS

Various embodiments of this disclosure that are proposed as examples will be described in detail with reference to the following figures, wherein like numerals reference like elements, and wherein:

FIG. 4 shows a table including content of a master information block (MIB) of an NB-IoT network according to an embodiment of the disclosure;

FIG. 6 shows a table including content of a MIB of an LTE network according to an embodiment of the disclosure;

FIGS. 8A and 8B show two examples for extending static information section with semi-static information bits according to an embodiment of the disclosure;

DETAILED DESCRIPTION OF EMBODIMENTS

Figure 1:
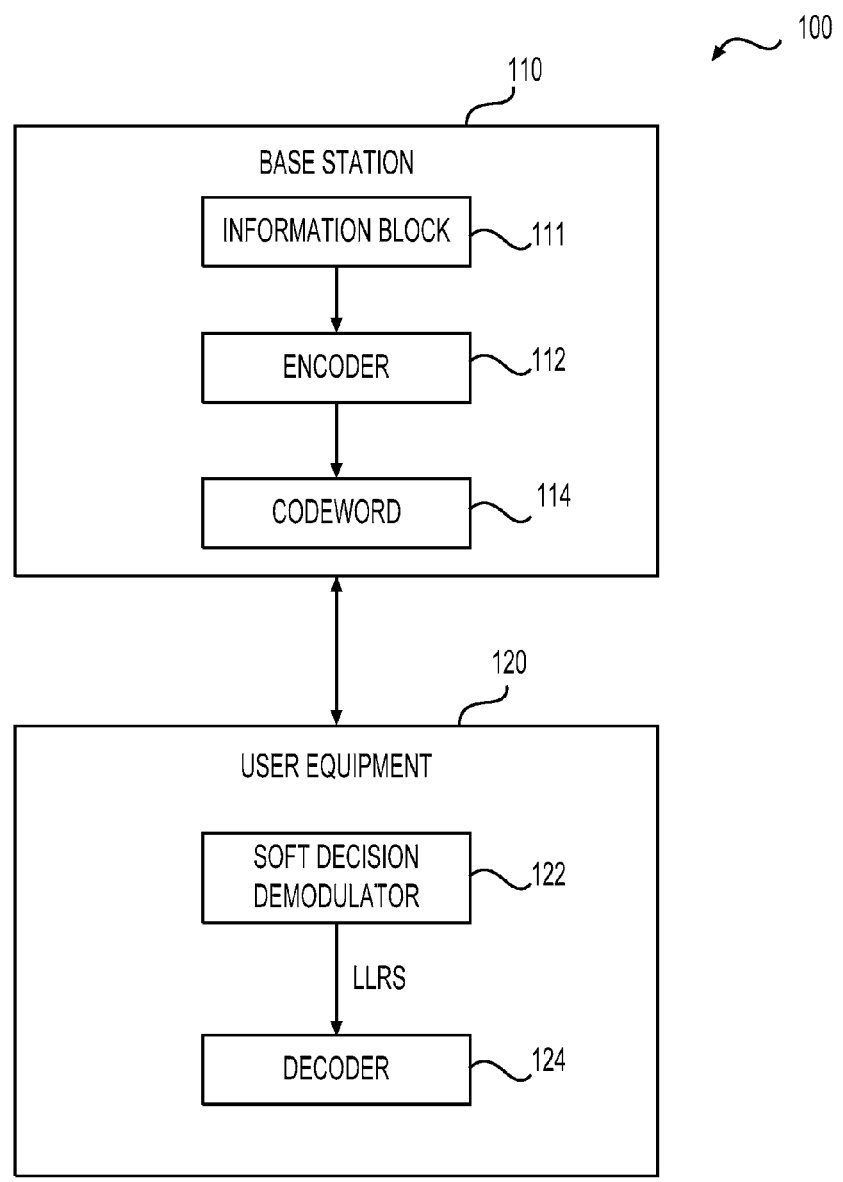
FIG. 1 shows an exemplary cellular wireless network according to an embodiment of the disclosure.

FIG. 1 shows an exemplary cellular wireless network 100 according to an embodiment of the disclosure. As shown, the wireless network 100 can include a base station 110 and user equipment (UE) 120.

The base station 110 includes an encoder 112 that encodes an information block 111 into a codeword 114. The base station 110 can transmit encoded information to the UE 120 via a wireless downlink. The base station 110 can also receive information from the UE 120 via a wireless uplink. In one example, the cellular wireless network 100 can be a Long-Term Evolution (UE) network implementing the LTE standard developed by the 3rd Generation Partnership Project (3GPP). In another example, the cellular wireless network 100 can be an NB-IoT network implementing the NB-IoT technology specified by the 3GPP NB-IoT standard.

The UE 120 includes a soft decision demodulator 122 and a decoder 124. The soft decision demodulator 122 demodulates a signal carrying the codeword 114 to generate a set of bit reliability values (BRVs) (for example, in the form of log likelihood ratios (LLRs)). The decoder 124 receives the set of BRVs from the soft decision demodulator 122 and decodes the codeword 114 based on the set of BRVs. The UE 120 can receive and transmit information from and to the base station 110 via a wireless signal.

In operation, the encoder encodes an information block 111 to generate a codeword 114 and transmits the codeword to the UE 120. The UE 120 receives the codeword 114 from the base station 110, and performs decoding operations to recover the information block 111. This operation can be repeated over more than one transmission time intervals (TTIs) of the information blocks 111 until the UE 120 successfully acquires an information block 111. Content of the information blocks 111 may change for different TTIs, however, certain data fields in each information block 111 does not change across TTIs. Accordingly, due to the encoding process by the encoder 112, each codeword has a static code section including static code bits that do not change across TTIs and are repeatedly transmitted for different TTIs.

According to an aspect of the disclosure, the UE 120 can take advantage of the static code bits by employing a BRV combination technique to accelerate the decoding process. Specifically, the UE 120 can combine a first set of BRVs of the static code bits from a first transmission during a first TTI with a second set of BRVs of the same set static code bits from a second transmission during a second TTI to obtain a set of combined BRVs. The set of combined BRVs can be subsequently used for decoding the second codeword transmitted during the second TTI. In this way, possibility of successfully decoding the second codeword can be improved, leading to accelerated information block acquisition process.

In one example, the base station 110 broadcasts an information block 111. The information block 111 includes parameters of the cellular wireless network 100 and can be used by the UE 120 for gaining an initial access to the base station 110. In addition, the information block 111 may include an error detection code, such as a cyclic redundancy check (CRC) code for error detection purpose. During each TTI for transmission of the information block 111, the encoder 112 receives a bit sequence of the information block 111, and encodes the information block 111 to generate a codeword 114 for error control purpose. For example, error correction codes, such as linear block codes, tail biting convolutional codes (TBCCs), and the like, can be employed for the encoding process. The codeword 114 is then carried by a modulated signal and transmitted from the base station 110 to the LIE 120. Various modulation schemes can be employed, such as phase-shift keying (PSK), quadrature amplitude modulation (QAM), orthogonal frequency-division multiplexing (OFDM) modulation, and the like. In addition, in some examples, additional signal processing operations may be performed to the codeword 114 before the modulation operation, such as interleaving, rate matching, scrambling, multiple-input and multiple-output (MIMO) processing, and the like.

At the LTE 120 side, the UE 120 tries to decode the received modulated signal to acquire parameters of the wireless network 100. Specifically, the soft decision demodulator 122 receives the modulated signal and calculates a set of BRVs (for example, in the form of LLRs) for each code bit in the codeword 114 based on the modulated signal. Generally, a hard decision demodulator produces a binary value 1 or 0, referred to as a hard decision, for a code bit as result of the demodulation operation, while a soft decision demodulator produces a real value, referred as a soft decision, for a code bit which takes a value within a range. In some examples, the real value soft decisions are quantized before output. As a result of the soft decision demodulation, more information reflecting the transmission result can be kept in a soft decision than in a hard decision.

The soft decision demodulator 122 calculates a BRV for each code bit as the soft decision output. The BRV of a code bit reflects the reliability of the received code bit. In other words, the BRV reflects a confidence of the received code bit being a 1 or 0. Generally, the BRV for a code bit is determined by the transmitted code bit (0, or 1) and the channel condition for transmitting the code bit. The BRV can be calculated according to the modulated signal received at the soft decision demodulator 122. Specifically, depending on the modulation schemes, the BRV can be calculated with different methods. In the art, various methods for calculating the BRVs for different modulation schemes have been developed.

In one example, the soft decision demodulator 122 calculates an LLR for each code bit as the BRV of the code bit. The LLR refers to the logarithm value of the ratio of the probability of the transmitted code bit being a binary symbol (e.g., 1) to that of the transmitted code bit being another binary symbol (e.g., 0), as expressed by the following expression, $$L(u) = \log \frac{P(u=1)}{P(u=0)}.$$

Accordingly, the sign and the magnitude of the BRV L(u) can reflect how confident the received code bit being a 0 or 1. For example, when P(u=1)=P(u=0), L(u) equals 0, meaning the code bit have equal probabilities to be 1 or 0. When P(u=1)>P(u=0), L(u) is positive, meaning the code bit have a larger probability to be 1. In addition, the larger the magnitude of L(u), the bigger the probability of the code bit being 1. In contrast, when P(u=1)<P(u=0), L(u) is negative, meaning the code bit have a larger probability to be 0. In addition, the larger the magnitude of L(u), the bigger the probability of the code bit being 0.

In one example, the wireless network 100 is an LTE network, and accordingly OFDM modulation is used for transmission of the codeword. The soft decision demodulator 122 can include an OFDM demodulator and an LLR calculation circuit. The OFDM demodulator generates modulation symbols in complex form based on the received modulated signal carrying the codeword 114. Subsequently, the LLR calculation circuit calculates LLRs for each code bit based on the modulation symbols. Subsequently, the LLRs are fed to the decoder 124 for the decoding process.

In some examples, corresponding to processing operations performed at the base station 110, additional reversal signal processing operations may be performed to BRVs of the codeword 114 during or after the demodulation process. The additional signal processing operations may include de-MIMO processing, de-scrambling, de-rate matching, de-interleaving, and the like.

The decoder 124 receives the BRVs corresponding to each code bit of the codeword 114, and performs a soft decision decoding process based on the BRVs in order to recover the information block 114. In one example, the decoder 124 is a maximum likelihood (ML) decoder 124. The ML decoder 124 implements a ML decoding algorithm, such as the Viterbi algorithm or its variants. The ML decoder 124 produces the most likely codeword as its output based on the received BRVs of the codeword 114. For example, when decoding a convolutional code, the Viterbi decoder calculates branch metrics using the BRVs and, based on the calculated branch metrics, selects among candidate codewords a codeword that has a minimum Euclidean distance from the received codeword to be an estimate of the codeword 114. In another example, the decoder 124 is a maximum a posteriori (MAP) probability decoder 124, referred as a MAP decoder. The MAP decoder 124 implements a MAP decoding algorithm, such as a BUR algorithm and its variants. The MAP decoder 124 operates on the BRVs on a bit-by-bit basis to produce the most likely binary bit (1, or 0) of each code bit as output.

The soft decision decoding process may generate an estimate of the codeword 114 based on the BRVs of each code bit. Based on the estimate of the transmitted codeword, a bit sequence can be determined to be a decoded version of the transmitted bit sequence of the information block 114. The determination can be based on the mapping relationship between codewords and bit sequences of the information block 111 determined by the encoder 112.

Finally, a cyclic redundancy check (CRC) is performed to verify whether the decoded version is decoded correctly. In some examples, the CRC can be scrambled at the base station 110 before being added to the information block 111. The scrambling operation can be based on a bit sequence indicating the number of antennas used by the base station 110. During the process of gaining initial access to the base station 110, the UE 120 may not have knowledge of the number of antennas. Accordingly, the UE 120 can perform a blind decoding. For example, the UE 120 may try different bit sequences to descramble the CRC to obtain several versions of CRCs, and try several CRC checks, respectively, to valid the decoded version.

When the decoding is not successful for a first codeword 114 transmitted during a first TTI, the UE 120 may perform the above decoding process for a second time. However, the second decoding process may be performed towards a second codeword 114 transmitted during a second TTI. The second codeword 114 may carry an information block 111 having different content from the one transmitted during the first TTI. At this stage, the decoder 124 may employ the BRV combination technique to assist the decoding process for decoding the second codeword, which may accelerates the process for acquisition of the information block 111.

The encoder 112, the soft decision demodulator 122, and the decoder 124 can be implemented with any suitable software, hardware, or combination thereof. When implemented in hardware, the hardware may comprise one or more of discrete components, an integrated circuit, an application-specific integrated circuit (ASIC), etc.

Figure 2:
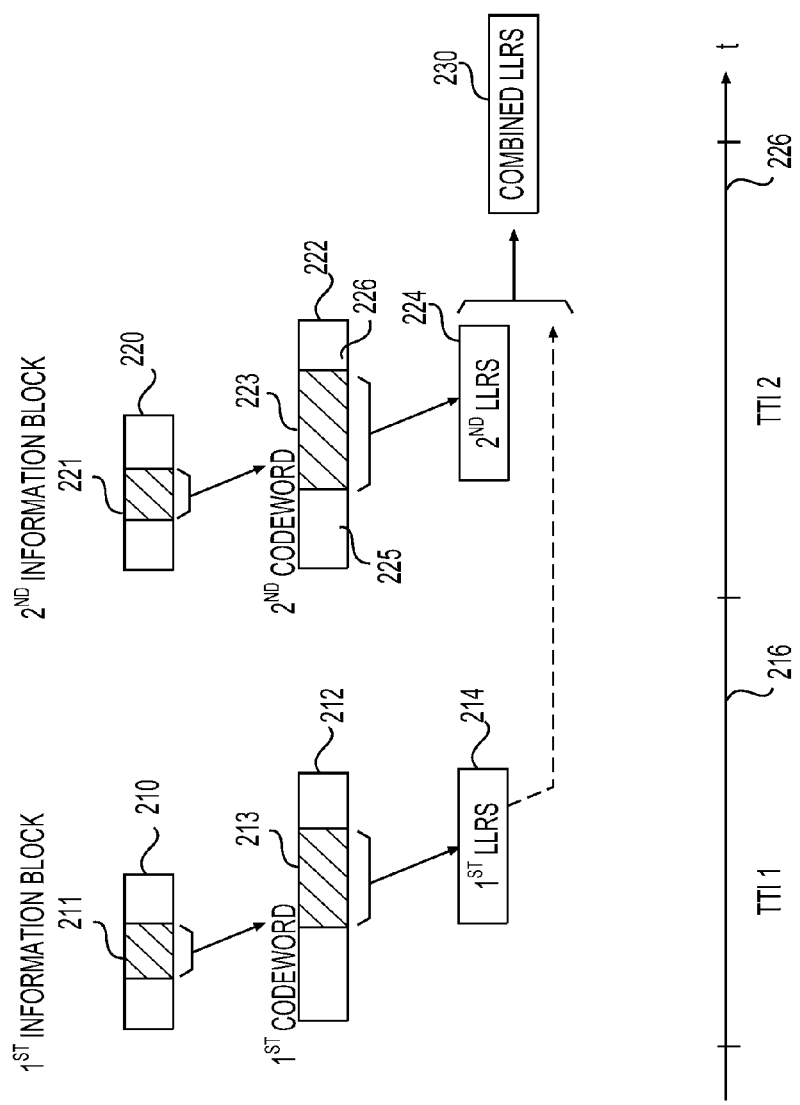
FIG. 2 shows an example of a bit reliability value (BRV) combination technique according to an embodiment of the disclosure.

FIG. 2 shows an example of the BM combination technique according to an embodiment of the disclosure. As shown, during a first TTI 216 of the information block 111, a first information block 210 including a first bit sequence is generated at the base station 110 and encoded by the encoder 112 to generate a first codeword 212. Specifically, the first information block 210 includes a static information section 211. The static information section 211 includes a sequence of static information bits. The static information hits refer to binary information that does not change across TTIs. For example, the information block 111 may include multiple data fields corresponding to multiple parameters. Part of the fields does not change for different TTIs. Accordingly, information bits corresponding to those fields do not change for different TTIs.

The first codeword 212 includes a static code section 213. The static code section 213 includes a sequence of static code bits. Particularly, the static code bits in the static code section 213 are produced from the static information bits in the static information section 211, thus do not change for different TTIs. For example, the encoder 112 employs TBCCs for encoding the information blocks in one example. Accordingly, due to the property of the TBCC, the sequence of the static code bits in the static code section 213 can be determined exclusively by the static information bits in the static information section 211.

When a modulated signal carrying the codeword 212 is processed at the soft decision demodulator 122, a set of LLRs corresponding to each code bit in the first codeword 212 can be produced. Particularly, the set of LLRs for the first codeword 212 can include a first set of LLRs 214 corresponding to each static code bit in the static code section 213 as shown in FIG. 2. The encoder 124 receives the set of LLRs of the first codeword 212, and performs a soft decision decoding. Assuming a decoding process for the first codeword 212 is unsuccessful due to poor channel conditions, the encoder 124 can first keep the first set of LLRs 214 corresponding to each static code bit in the static code section 213. For example, the encoder may store the first set of LLRs 214 to a memory, such as a set of registers. Then, the encoder 124 can proceed to perform a second decoding process.

As shown, the second decoding process may takes place in a second TTI 226. During the second TTI 226, a second information block 220 is generated, part of which can be different from the first information block 210. The encoder 112 encodes the second information block to generate a second codeword 222. Similarly, the second information block 220 includes a static information section 221. The static information section 221 includes the same set of data fields as the information section 211 that does not change across TTIs. Also similarly, the second codeword 222 includes a static code section 223. Static code bits in the static code section 223 are exclusively resulted from the static information bits in the static information section 221 during the encoding operation of the encoder 112. Thus, the static code sections 223 and 213 have the same set of code bits which are transmitted twice.

During the soft decision demodulation process, a set of LLRs are calculated for the second codeword 222. Similarly, the set of LLRs of the second codeword 222 includes a second set of LLRs 224 corresponding to the static code bits in the static code section 223 as shown in FIG. 2. The set of LLRs of the second codeword 222 is passed and received at the decoder 124.

Subsequently, to employ the BRV combination technique, the decoder 124 can combine the first set of LLRs 214 corresponding to the static code section 213 with the second set of LLRs 224 corresponding to the static code section 223 to generate a third set of combined LLRs 230 for each static code bit in the static code section 223, respectively. Then, the third set of combined LLRs 230 together with LLRs corresponding to code bits in other sections 225 and 226 of the second codeword 222 are used as input BRVs to a soft decision decoding process. The decoder 124 decodes the second codeword 222 using the third set of combined LLRs 230 and the LLRs of the other sections 225 and 226. Consequently, the decoder 124 produces an estimate of the second codeword 222, and a decoded version of the information block corresponding to the estimate of the second codeword 222 is determined subsequently.

In one example, the above combination operation is performed by adding the first set of LLRs 214 and the second set of LLRs 224 to generate a third set of aggregated LLRs 230 for each static code bit in the static code section 223, respectively.

The combination operation can be understood as obtaining a better confidence about what has been transmitted by observing a same code bit being transmitted twice. In other words, combined information obtained from two separate transmissions of a same binary symbol (0 or 1) provides more information for guessing which binary symbol has been transmitted than using information from a single transmission. The increased confidence of which binary symbol has been transmitted is indicated by the combined BRV of the respective code bit.

As a result of the increased confidence, the soft decision decoding process at the decoder 124 can have a higher probability to make a correct estimation of a transmitted codeword. For example, during a TBCC Viterbi decoding process, aggregated LLRs can lead to a smaller Euclidean distance value for each branch metric of an expected codeword (which has the smallest Euclidean distance from the transmitted codeword), which results in a higher probability of obtaining a correct estimate. Consequently, numbers of repetitive decoding trials can be reduced, and speed of information block acquisition can be accelerated. Accordingly, power consumption of the UE 120 can be reduced.

The BRV combination operation is performed across two TTIs in above description. However, BRV combination operation can be performed across more than two TTIs in other examples. For example, in FIG. 2, assuming at the end of the second decoding process, a CRC check generates a negative result, and the second decoding process is not successful, the decoder 124 may try a third time to acquire information in a third information block using the BRV combination technique. For example, to do that, another set of LLRs corresponding to a third codeword can be calculated. The decoder 124 may aggregate the combined LLRs 230 resulted during the second decoding process with a set of LLRs corresponding to the static code section of the third codeword to generate a new set of combined LLRs. The new set of combined LLRs is subsequently used for decoding the third codeword.

Figure 3:
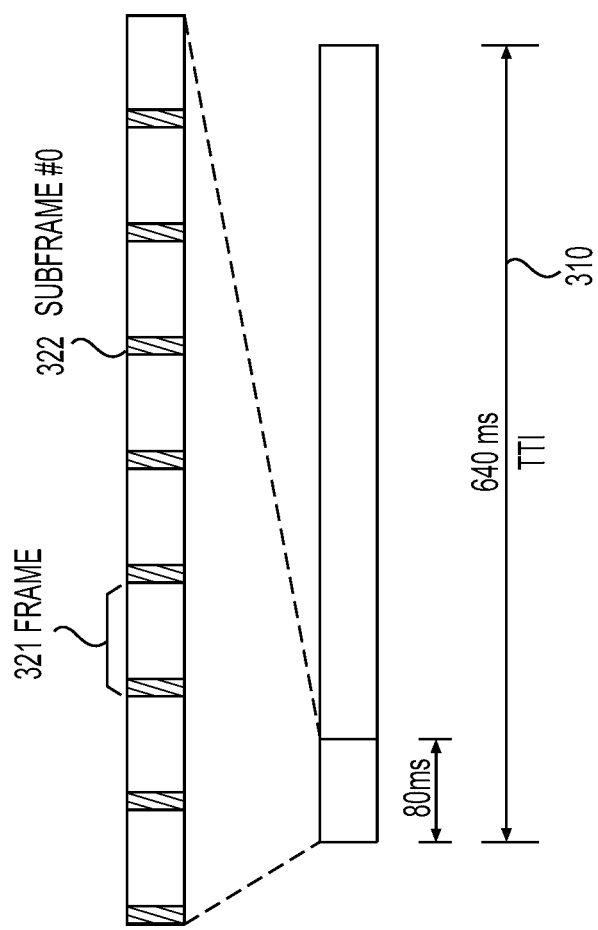
FIG. 3 shows a frame structure of a modulated signal according to an embodiment of the disclosure.

FIG. 3 shows a frame structure of a modulated signal according to an embodiment of the disclosure. In one example, the modulated signal is broadcasted from the base station 110 in the wireless network 100. The wireless network 100 implements the NB-IoT technology. In NB-IoT, a master information block (MIB) carries parameters of the wireless network. The MIB is encoded by the encoder 112, for example, using TBCCs, and is transmitted to the UE 120. The MIB can include multiple fields, and part of the fields does not change across TTIs. Thus, information bits corresponding to those fields can be static for different TTIs. Through the encoding process, static code bits in a static code section can be produced. The static code bits do not change over different TTIs.

In the transmission, the MIB is carried in a physical broadcasting channel (PBCH) of the NB-IoT radio interface. A TTI 310 for MIB transmissions is 640 ms. As shown, a number of 64 frames 321 are transmitted during one TTI 310. Each frame 321 includes 10 sub-frames, and carries PBCH data in sub-frame #0 322. Accordingly, content of the MIB in the form of PBCH data is repeatedly transmitted in each frame 321 within one TTI. In addition, PBCH data in each sub-frame #0 is decodable independently.

In one example, during a process for gaining initial access to the base station 110, the LE 120 tries to decode the PBCH to acquire the MIB without knowledge of MIB TTI boundaries. In addition, the BRV combination technique is employed for the PBCH decoding process. Specifically, the decoding process may be first performed towards a first set of PBCH data carried in a first sub-fame within a first TTI. Assuming the first try is unsuccessful, a first set of LLRs corresponding to the static code section of the MIB is stored. The decoder 124 can then try to decode a second set of PBCH data. The second set of PBCH data can be transmitted within the first TTI the same as that of the first set of PBCH, or within a second TTI which is different from the first TTI. Without knowing the TTI boundary, the decoder 124 can still employ the BRV combination technique, for example, performing BRV combination operation over the static code bits of a codeword corresponding to the MIB. In this way, benefit of the BRV combination technique can be obtained even the PBCH data is transmitted within a TTI.

FIG. 4 shows a table 400 including content of a MIB of an NB-IoT network according to an embodiment of the disclosure. Names of MIB parameters are listed in the first column 410. Specifically, the parameters include system frame number (SFN), hyper-SFN (H-SFN), SIB1 scheduling information and TBS, system information value tag, access barring information, operation mode and same-PCI indication, and operation mode dependent parameters, which are included in rows 422-428, respectively. In addition, spare bits and CRC are listed in rows 429 and 430. The numbers of bits of each parameter, or spare bits and CRC, are listed in the second column 412. A total number of 50 bits is shown in the row 431. How frequently one parameter changes is described in the third column 414.

As shown, the parameters in rows 424-429 (including the spare bits) do not change across TTIs. These parameters in rows 424-429 typically depend on scenario of cell deployment, and are seldom updated unless cell re-planning is necessary, for example, due to increasing number of UEs. Thus, bits corresponding to these parameters form the static information bits in the MIB. The SFN and CRC change across TTIs, thus bits of which in the MIB are referred to as varying information bits. The H-SFN may change over two TTIs, however, can maintain its value for 16 TTIs. Accordingly, bits of H-SFN in the MIB are referred to as semi-static information bits. The semi-static information bits can also be exploited by the BRV combination technique to accelerate PBCH decoding process as shown below.

Figure 5:
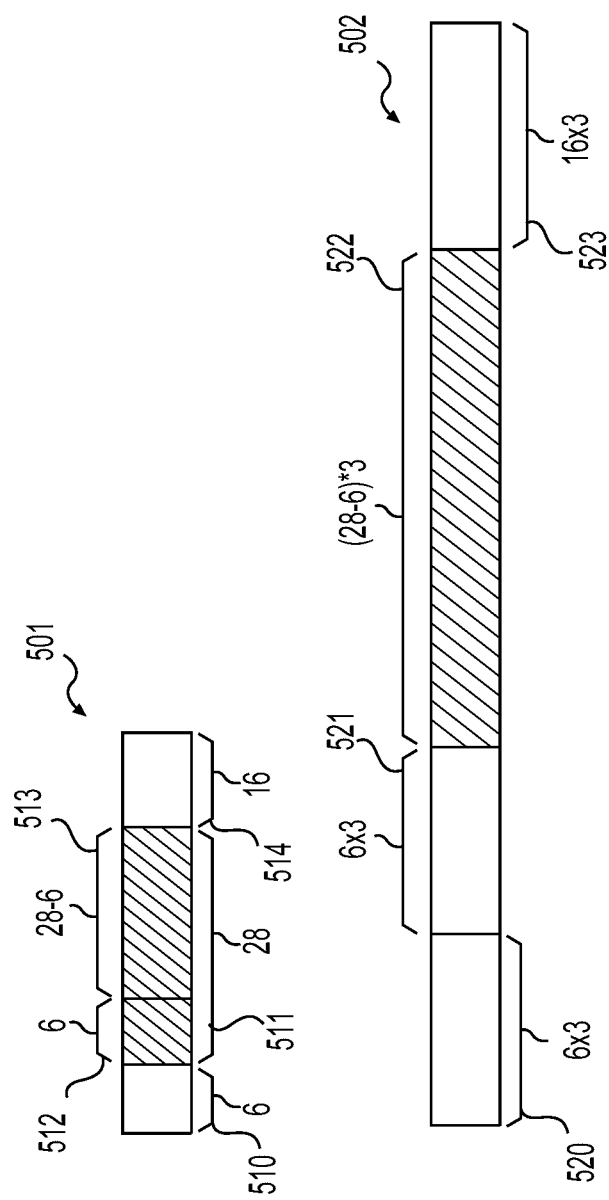
FIG. 5 shows a mapping relationship between static information bits and static code bits according to an embodiment of the disclosure.

FIG. 5 shows a mapping relationship between static information bits and static code bits according to an embodiment of the disclosure. FIG. 5 includes a MIB 501 and a codeword 502. The codeword 502 is generated by encoding the MIB 501 at the encoder 112.

The MIB 501 includes content shown in table 400. Specifically, the MIB 501 includes a first varying section 510 including 6 bits of the parameters SFN and H-SFN in table 400, and a second varying section 514 including 16 bits of the CRC in table 400. In addition, the MIB 501 includes a static information section 511 which includes the other parameters of rows 424-429 in table 400. The static information section 511 includes 28 static information bits that maintain their values across TTIs.

In FIG. 5 example, ⅓ TBCCs with a constraint length W=7 is used at the encoder 112. During the encoding process, for each information bit of the MIB 501 entering the encoder 112, three parity codes will be produced. Thus, each information bit corresponds to 3 parity bits. Accordingly, 6 varying or semi-static information bits in the first varying section 510 result in 6×3=18 code bits in a first section 520 of the codeword 502 which will vary across TTIs. Then, the next 6 static information bits in section 512 in the MIB 501 enters the encoder 112 resulting in 6×3=18 code bits in a second section 521 in the codeword 502. Due to the constraint length W=7, one or more varying information bits previously entering the encoder 112 are still stored in the encoder 112 affecting state of the encoder 112. Thus, the 18 code bits in the section 521 will vary across TTIs although the 6 static information bits in section 512 belongs to the static information section 511.

Thereafter, (28-6) static information bits in section 513 enters the decoder 112, and (28-6)×3 code bits in section 522 are generated accordingly. As 7 static information bits have entered the encoder 112 at this moment, the state of the encoder 112 is updated by the 7 static information bits and not affected by any previously received varying information bits in section 510. Consequently, the code bits in section 522 do not change across TTIs, thus being referred as static code bits. Finally, 16 varying information bits in section 514 are fed into the encoder 112 resulting in the 16×3=48 code bits in section 523 in the codeword 502 which will vary across TTIs.

As shown above, the position of the static code section 522 in the codeword 502 can be determined according to encoding method used at the encoder 112. Accordingly, position information of a static code section in codewords can be pre-configured in the UE 120.

It is noted that the FIG. 5 example is for illustrative purpose, and the BRV combination technique is not limited to TBCCs. In various embodiments, various types of error correction codes can be used at the encoder 112, such as linear block codes, convolutional codes, turbo codes, and low-density parity-check (LDPC) codes, and the like. Those various types of codes can result in a static code section in a codeword when an information block including a static information section is fed into the respective encoders. Accordingly, the BRV combination technique together with ML or MAP soft decision decoding algorithms can be used over the static code bits across TTIs to improve respective decoding process.

FIG. 6 shows a table 600 including content of a MIB of an LTE network according to an embodiment of the disclosure. Names of MIB parameters are listed in the first column 610. Specifically, the parameters include DL-bandwidth, phich-configuration, and SFN included in rows 622-624, respectively. In addition, spare bits and CRC are listed in rows 625 and 626. Numbers of bits of each parameter, or spare bits and CRC, are listed in the second column 612. A total number of 40 bits is shown in row 627. How frequently one parameter changes is described in the third column 614. TTI of the MIB lasts 40 ms.

As shown, the parameters in rows 622-623 and the spare bits in row 625 do not change across TTIs. Thus, bits corresponding to these parameters are static information bits in the MIB. However, the SFN and CRC in rows 624 and 626, respectively, change across TTIs, thus bits of which are varying information bits in the MIB. Particularly, the parameters in the MIB are ordered in a way that the static information bits and the varying information bits are interleaved.

Figure 7A:
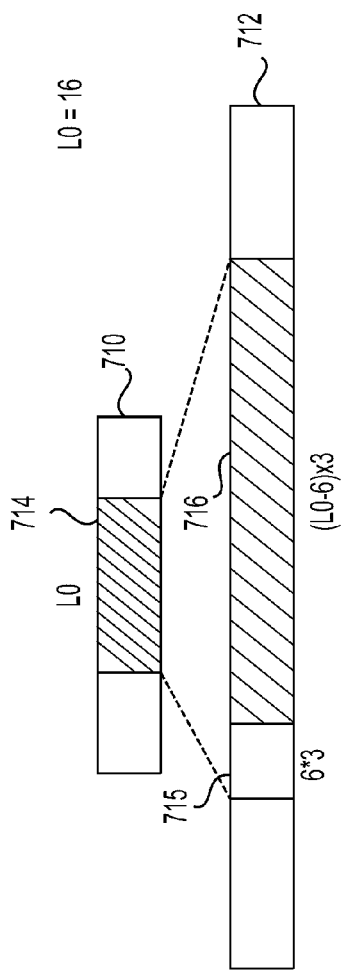
FIGS. 7A and 7B shows two codewords generated from two MIBs, respectively, at an encoder according to an embodiment of the disclosure.
Figure 7B:
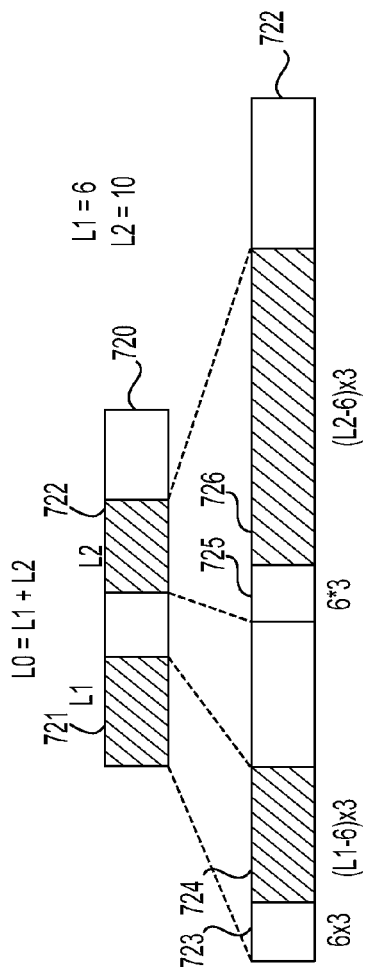

FIGS. 7A and 7B shows two codewords 712 and 722 generated from two MIBs 710 and 720, respectively, at the encoder 112 according to an embodiment of the disclosure. The MIBs 710 and 720 includes content of the MIB in FIG. 6 example. However, the parameters (or data fields) in the two MIBs 710 and 720 are arranged in different orders, resulting in different sizes of static code bit sections in the two codeword 712 and 722. The ⅓ TBCCs with a constraint length W=7 are used for the encoding process in FIG. 7A or 7B examples.

Specifically, in FIG. 7A, 16 static information bits of parameters or spare bits in rows 522, 523, and 525 in table 600 are arranged together forming a static information section 714. The 16 static information bits do not change across TTIs. The size of the 16 static information bits is represented by L0. After the encoding process, a static code section 716 including (L0-6)×3=30 static code bits is generated. In addition, due to the constraint length, 6×3=18 varying code bits are generated in a section 715 of the codeword 712. The 6×3=18 varying code bits correspond to the first 6 static information bits in the static information section 714.

In contrast to FIG. 7A, in FIG. 7B, the 16 static information bits are separately arranged: the 6 information bits corresponding to the two parameters in rows 522 and 523 in table 600 are in section 721, while the other 10 information bits corresponding to the spare bits in row 525 are in section 722. The sizes of the sections 721 and 722 are represented as L1 and L2, respectively. After the encoding process, two static code sections 724 and 726 are generated corresponding to the two static information sections 721 and 722, respectively, in the codeword 722. In this special case, the static code section 724 has zero bits. In general, in TBCC encoding, when a size of a static information section is equal to or smaller than the constraint length minus 1 (W-1), no static code bits can be produced from the encoding process. However, in FIG. 7B, the size of the static code section 724 is represented as (L1-6)×3 to facilitate a more general discussion.

In addition, two set of varying code bits each having a size of 6×3=18 bits are also generated in sections 723 and 725, respectively, in the codeword 722. The 6×3=18 varying code bits in section 723 correspond to the first 6 static information hits in the static information section 721. Similarly, the 6×3=18 varying code bits in section 725 correspond to the first 6 static information bits in the static information section 722.

Comparing FIG. 7A and FIG. 7B, a total size of the two static code sections 724 and 726, (L1-6)×3 (L2-6)×3, in FIG. 7B is smaller than the size of the static code section 716 in FIG. 7A. The difference equals the size of the section 725. As can be seen, when parameters or data fields in a MIB are ordered differently, different number of static code bits that do not change across TTIs will be different. When the parameters or data fields including static information bits are arranged adjacent to each other, a larger size of static code section can be achieved than arranging the parameters or fields separately.

Accordingly, in some examples, the encoder 112 is configured to first reorder parameters or fields of an information block 111 such that parameters or data fields having static information bits that do not change across TTIs are arranged together. Subsequently, the encoder 112 performs encoding operation on the reordered information block. In some examples, the information block received at the encoder 112 may include a CRC calculated based on other fields of the information block 111. In this case, the encoder 112 can first perform the reordering operation on the fields (not including the CRC), and then calculate a new CRC replacing the previous CRC. Alternatively, when the information block 111 does not include a CRC, the encoder 112 can calculate a CRC after the reordering operation for the reordered information block. By the above reordering process, an increased number of static code bits in a codeword can be obtained. Accordingly, an increased number of combined BRVs can be exploited for the decoding process at the decoder 124, leading to a higher decoding performance.

It is noted the BRV combination technique is applicable for codewords with separated static code sections. For example, BRV combination operation can be operated over multiple static code sections in a codeword at the decoder 124 to improve the decoding performance.

FIGS. 8A and 8B show two examples for extending static information section with semi-static information bits according to an embodiment of the disclosure. As shown in table 400, the H-SFN parameter may change across TTIs, but maintains its value for at least 16 TTIs. Thus, for BRV combination operations performed at the decoder 124 over two TTIs, there is a high probability that the H-SFN parameter does not change across the two TTIs. Taking advantage of the infrequency of changing of a data field in an information block, information bits in an infrequently-changing data field, referred to as semi-static information bits, can be counted as static information bits for the BRV combination technique.

Specifically, as shown in FIG. 8A, an information block 801 includes a first section 811 including static information bits, such as bits of parameters in rows 424-429 in table 400 that do not change across TTIs. Number of the static information bits in section 811 is represented by L1. In addition, the information block 801 can further include a second section 812 which includes semi-static information bits, such as bits of H-SFN in table 400. Number of the semi-static information bits is represented by L2. As discussed above, now an expanded static information section including sections 812 and 811 are obtained with a size of L1+L2.

FIG. 8B shows another example where another type of semi-static information bits are used. As shown in table 400, the SFN parameter includes 4 bits that change across TTIs. However, the 4 bits in the SFN parameter change at different frequencies. For example, the most significant bit (MSB) changes at a slower rate than other less-significant bits. Accordingly, a portion of the SFN parameter including, for example, the first 2 MSBs can be count as semi-static information bits which may change for every 4 TTIs, for example. With this second type of semi-static bits, static code section in a codeword can be further extended.

The first type of semi-static information bits refer to all information bits in a parameter of an information block that changes across TTIs but may maintain their value for at least two TTIs. The second type of semi-static information bits refers to a portion (one or more MSBs) of information bits of parameters that may maintain its values for one, two, or more TTIs. It is noted that the first and second type of semi-static information bits may overlap depending on configurations for the BRV combination technique. For example, for a parameter in a MIB which maintains its value for every 4 TTIs of the MIB transmission, all bits in the parameter can be included in a static information section. However, in another configuration, only the first two MSBs are counted in the static information section. In the latter case, number of semi-static information bits is less than in the former case, but changing frequency of the group of semi-static information bits is lower than that of the former case where all bits in the parameter are used.

In FIG. 8B, another information block 802 includes a first section 821 with a size of L3. The first section can include static information bits and semi-static information bits, such as bits of parameters in rows 423-429 in table 400. The information block 802 further includes a second section 822 with a size of L4. The second section 822 includes semi-static information bits which are part (for example, the first two MSBs) of the SFN parameter in table 400 which is contained in section 823. As a result, the sections 821 and 822 together can form an extended static information section for the BRV combination technique.

Corresponding to the above static information section extending technique, the BRV combination operation can be performed on code bits generated from semi-static information bits or static information bits.

In addition, corresponding to the above static information section extending technique, in some examples, the encoder 112 is configured to reorder parameters or data fields of an information block that include semi-static information bits as well as static information bits. Specifically, the encoder 112 can arrange groups of the static bits and the semi-static bits adjacent to each other in a same static information section. Each group of static bits or semi-static bits corresponds to a parameter in the information block. It is noted that a group of semi-static information bits can be arranged at any positions among other groups of static or semi-static information bits.

Further, the encoder 112 can attach a group of information bits, which corresponds to a parameter in the information block, at the end of a static information section such that the first one or more MSBs of the group of information bits are attached to the end of the other information bits in the static information section.

Figure 9:
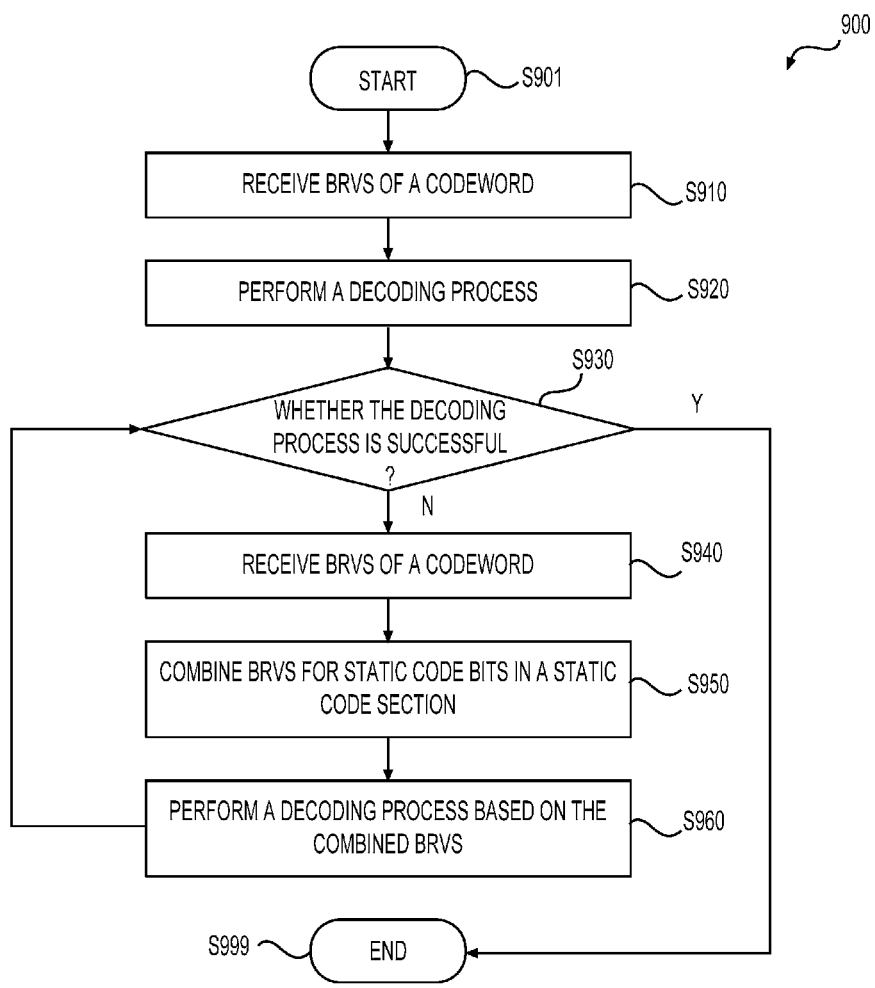
FIG. 9 shows a flowchart of a decoding process using the BRV combination technique according to an embodiment of the disclosure.

FIG. 9 shows a flowchart of a decoding process 900 using the BRV combination technique according to an embodiment of the disclosure. The decoding process 900 can be performed by the decoder 124 in the FIG. 1 example. The process 900 starts at S901, and proceeds to S910.

At S910, a first set of BRVs corresponding to a first codeword are received at the decoder 124. For example, the soft decision demodulator 122 receives a modulated signal carrying the first codeword and calculates a BRV corresponding to each code bit in the first codeword accordingly. The BRVs are then transmitted and received at the decoder 124. The first codeword can be generated from the encoder 112 which encodes a first bit sequence of an information block to generate the first codeword.

At S920, the decoder 124 performs a first soft decision decoding process based on the received first set of BRVs. An estimate of the first codeword can be produced as the output of the first decoding process.

At S930, whether the decoding process is successful is determined. For example, a CRC check is performed to verify whether errors exist in the estimate of the first codeword. When the decoding is determined to be successful, the process 900 proceeds to S999 and terminates at S999. Otherwise, the process 900 proceeds to S940.

At S940, a second set of BRVs of a second codeword can be received at the decoder 124. Similarly, the demodulator 122 can receive a modulated signal carrying the second codeword and calculates a BRV for each code bit in the second codeword. Also similarly, the second codeword can be generated from a second bit sequence of the information block.

At S950, BRVs corresponding to code bits in a static section of the first codeword and BRVs corresponding to code bits in the static section of the second codeword are combined on bitwise basis. As a result, a set of combined BRVs each corresponding to a code bit in the static section of the second codeword are obtained. In one example, BRVs corresponding to the static section of the first codeword and BRVs corresponding to the static section of the second codeword are aggregated on bitwise basis. Accordingly, aggregated BRVs are Obtained for code bit in the static section of the second codeword.

In one example, position information of the static section in a codeword is pre-configured at the decoder 124. Thus, the decoder 124 may know the position information in advance of the decoding process. In addition, the static code section may include static bits as well as semi-static bits.

In alternative examples, a codeword may include more than one static code sections. Accordingly, the combination operation can be performed over more than one static code sections.

At S960, a second soft decision decoding process is performed using the combined BRVs. Specifically, for code bits in the static section of the codeword, the combined BRVs are used for the decoding process. While for code bits outside of the static section, the BRVs received at S940 are used. The process 900 then returns to S930.

In some examples, in addition to operations performed at S950 and S960, the decoder 124 may be configured to perform decoding operation using the second set of BRVs of the second codeword received as S940 without using the combined BRVs. Alternatively, in some examples, the decoder 124 may be configured to perform decoding operation without using the BRV combination technique.

During the iteration of the process 900, at S950, the combination operation can be performed between combined BRVs obtained during previous iterations for each code bit in the static section and BRVs newly received at S940 for respective code bit.

In addition, an additional decision block can be added to the flow chart for terminating the process 900 when numbers of iterations reaches a maximum amount. For example, a step can be added between S930 and S940 to determine if such a maximum amount has been reached. If so, the process 900 can proceed to S999 and terminate at S999.

It is noted that, in some examples such as LTE or NB-IoT wireless system, PBCH data carrying a MIB can be transmitted periodically and repeatedly within a TTI, and the UE 120 may not have knowledge of TTI boundaries in advance. In such scenarios, the demodulation at the soft decision demodulator 122 and the decoding process at the decoder 124 can be performed towards PBCH data transmissions either within a TTI or across TTIs. In this way, decoding operations of the decoder 124 implementing the BRV combination technique can be performed either across TTIs or within a TTI.

Figure 10:
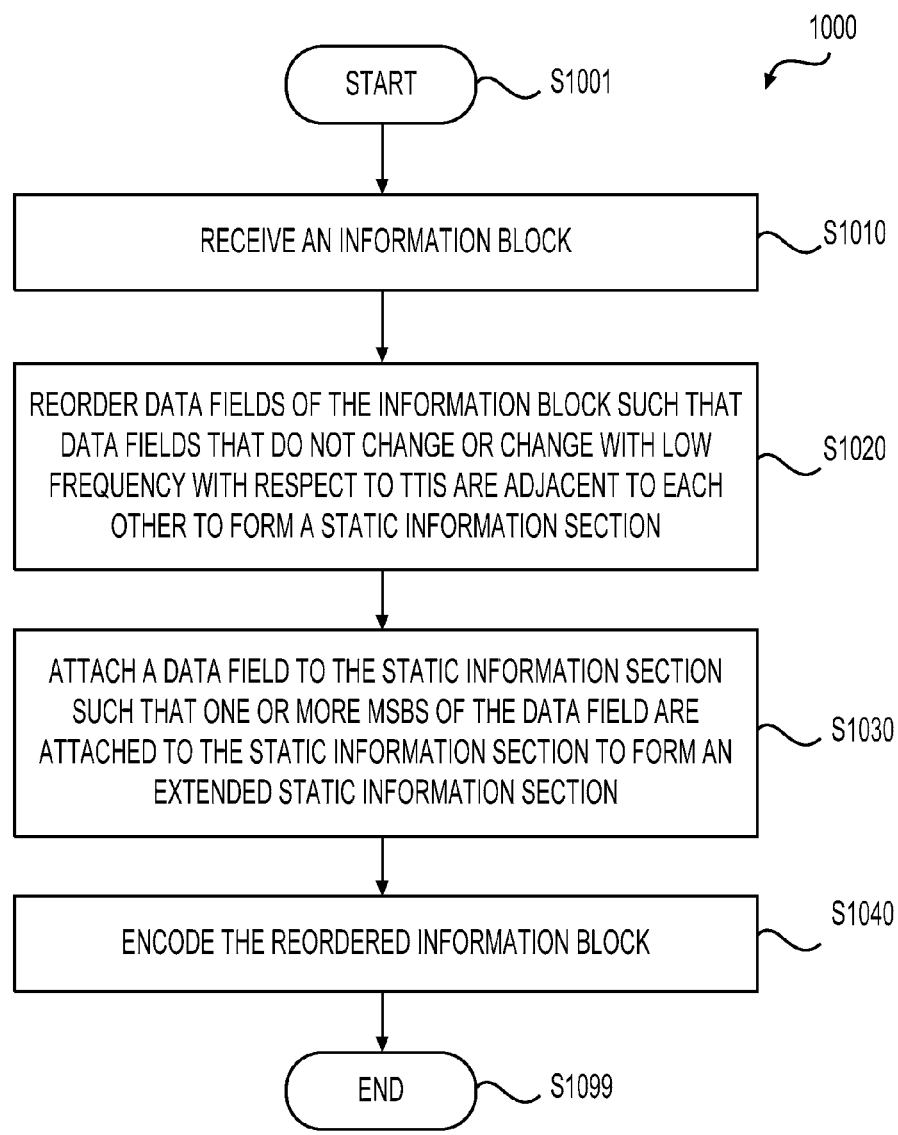
FIG. 10 shows a flowchart of a process for reordering data fields of an information bock according to an embodiment of the disclosure.

FIG. 10 shows a flowchart of a process 1000 for reordering data fields of an information bock according to an embodiment of the disclosure. The process 1000 can be performed by the encoder 112 in the FIG. 1 example. The process 1000 starts at S1001, and proceeds to S1010.

At S1010, an information block is received at the encoder 112. The information block, such as a MIB in NB-IoT network, can includes multiple data fields each corresponding to a parameter of the wireless network 100.

At S1020, the data fields in the information block are reordered in order to have a static code section in a codeword with a larger size. Specifically, in one example, parameters that do not change across TTIs are arranged adjacent to each other to form a static information section. Alternatively, in another example, parameters that do not change across TTIs and parameters that change across TTIs but with low frequency (for example, can maintain their values for at least two TTIs) are arranged adjacent to each other.

At S1030, a data field in the information block is attached to the static information section, such that one or more MSBs of the data field are attached to the static information section formed at S1020. As a result, an extended static information section is obtained in the information block which includes the one or more MSBs. Specifically, the attached data field can be a data field that changes from TTI to TTI, or a data field that maintains its value for several TTIs before changing its value. Although the attached data field can change with respect to the TTIs, the first one or more MSBs may have a slow changing rate (for example, may maintain their value for at least two TTIs).

At S1040, the reordered information block with the extended size is encoded to generate a codeword. The codeword may include a static code section generated from the extended static information section. Accordingly, a BRV combination technique can be performed over the respective static code section. The process proceeds to S1099, and terminates at S1099.

Figure 11:
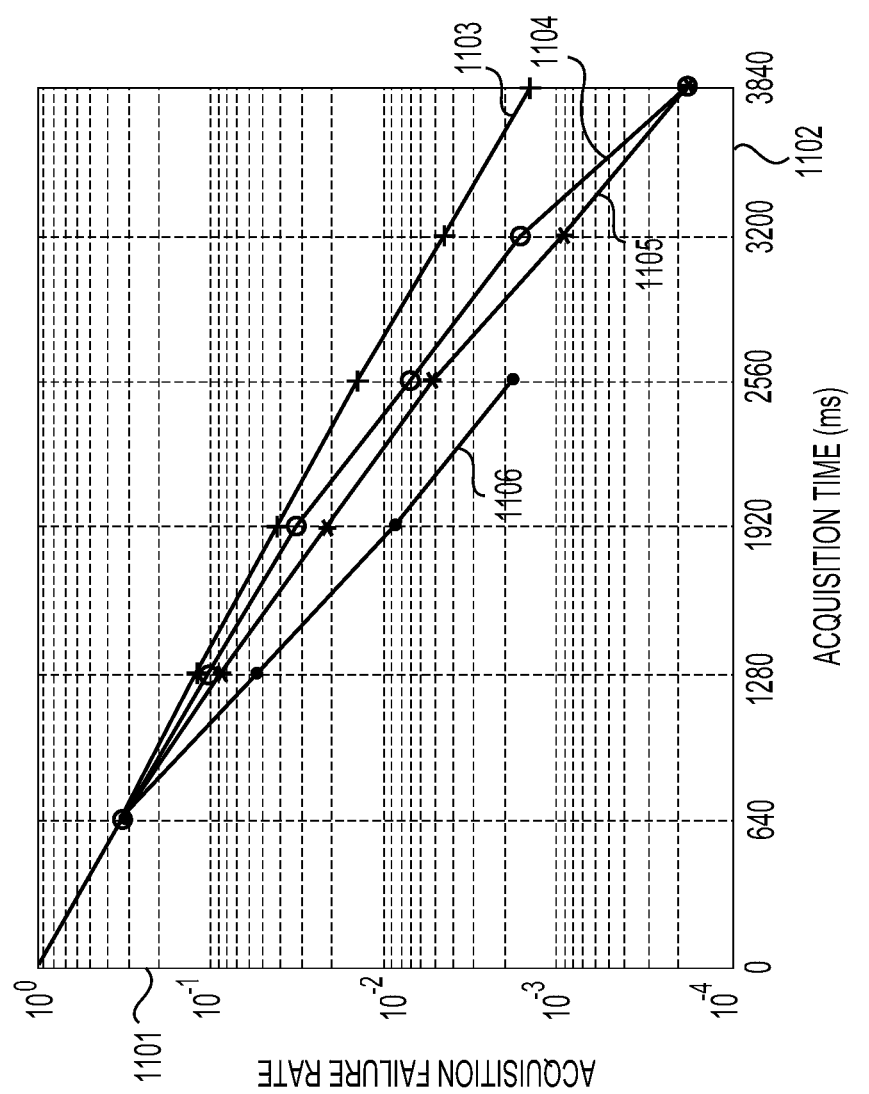
FIG. 11 shows simulation results of decoding performance of receivers implementing the BRV combination technique with different configurations.

FIG. 11 shows simulation results of decoding performance of receivers implementing the BRV combination technique with different configurations. In simulation, receivers with different configurations decode PBCH data from a transmitter in a NB-IoT network. The NB-IoT network adopts in-band deployment. Signal-to-noise ratio (SNR) for the transmission channel is set to be −12.6 dB. The minimum coupling loss (MCL) from the transmitter to the receiver is set to be 164 dB.

In FIG. 11, a vertical axis represents acquisition failure rate of simulated decoding process expressed with decibel scale. A horizontal axis represents acquisition time which is the maximum time configured for decoding a PBCH for gaining an initial access to the network. If the decoding for the PBCH is not successful within the acquisition time, the decoding operation will terminate. Another round of decoding operation takes place subsequently.

FIG. 11 shows 4 curves 1103-1106 corresponding to 4 different receiver configurations: a first receiver without implementing the BRV combination technique corresponding to curve 1103, and a second, third, and fourth receivers implementing the BRV combination technique corresponding to curves 1104-1106. In addition, codeword size for each receiver are configured to be 150 hits, however, static code section sizes are configured to be 33 bits, 66 bits and 150 bits for the second, third and fourth receivers, respectively.

As shown, the receivers implementing the BRV combination technique have a higher performance than the first receiver not implementing the BRV combination technique. In addition, performance of receivers implementing BRV combination technique increases when static code section size increases. For example, corresponding to the acquisition failure rate of 1%, the first to the fourth receivers each has an acquisition time of 2800 ms, 2400 ms, 2300 ms, and 1900 ms, showing acquisition time required for decoding the PBCH is reduced when static code section sizes increases corresponding to the assumed acquisition failure rate.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method, comprising:
    successively receiving at least two modulated signals carrying at least two codewords, respectively, at a user equipment (UE) from a base station in a wireless network, each of the at least two codewords corresponding to a bit sequence of an information block and including a static code section that includes static code bits;
    demodulating the at least two modulated signals successively, by processing circuitry, to generate bit reliability values (BRVs) of code bits in each of the at least two codewords;
    aggregating BRVs of the static code bits in the static code section of each of the at least two codewords to generate aggregated BRVs, each aggregated BRV corresponding to a static code bit in the static code section of each of the at least two codewords; and
    decoding, by the processing circuitry, the last one of the at least two codewords using the aggregated BRVs to recover the bit sequence of the information block corresponding to the last one of the at least two codewords.

2. The method of claim 1, wherein,
    the information block includes, in a static information section, static information bits that do not change for different transmission time intervals (TTIs) of the information block, and
    the static code bits in the static code section of each of the at least two codewords are generated from the static information bits of the information block through an encoding process.

3. The method of claim 2, wherein the static information section of the information block includes one or more significant bits (MSBs) of a data field of the information block.

4. The method of claim 1, wherein,
    the information block includes, in a static information section, static information bits that do not change for different TTIs of the information block, and semi-static information bits that do not change for at least two TTIs of the information block, and
    the static code bits in the static code section of each of the at least two codewords are generated from the static information bits or the semi-static information bits of the information block through an encoding process.

5. The method of claim 1, wherein each BRV is a log likelihood ratio (LLR) that is a logarithm value of ratio of probability of a transmitted code bit being a first binary symbol to that of the transmitted code bit being another binary symbol.

6. The method of claim 1, wherein each of the at least two codewords is one of a block code, a convolutional code, a turbo code, or a low-density parity-check (LDPC) code.

7. The method of claim 1, wherein the at least two codewords are tail biting convolutional codes (TBCCs).

8. The method of claim 1, wherein the information block is a Master Information Block (MIB) specified in 3GPP LTE standards or 3GPP NB-IoT standards.

9. A method of channel coding at a base station in a wireless network, comprising:
    successively receiving at least two bit sequences of an information block, the information block including two static data fields;
    including, by processing circuitry, the two static data fields of each of the at least two bit sequences such that the two static data fields are adjacent to each other to form a static information section in each of the at least two bit sequences;
    successively encoding, by the processing circuitry, the at least two bit sequences to generate at least two codewords, respectively, each including static code bits generated from information bits in the static information section of each of the at least two bit sequences;
    successively modulating the at least two codewords to generate at least two modulated signals, respectively; and
    successively transmitting the at least two modulated signals.

10. The method of claim 9, wherein the two static data fields of the information block each include static information bits that do not change for different transmission time intervals (TTIs) of transmitting the information block, or semi-static information bits that do not change for at least two TTIs of transmitting the information block.

11. The method of claim 9, further comprising:
    in each of the at least two bit sequences, attaching one or more significant bits (MSBs) of a data field of the information block at the end of the respective two adjacent static fields to form the respective static information section.

12. The method of claim 9 wherein the information block is a Master Information Block (MIB) specified in 3GPP LTE standards or 3GPP NB-IoT standards.

13. A decoder, comprising circuitry configured to:
    successively receive at least two modulated signals carrying at least two codewords, respectively, at a user equipment (UE) from a base station in a wireless network, each of the at least two codewords corresponding to a bit sequence of an information block and including a static code section that includes static code bits;
    demodulate the at least two modulated signals successively, by processing circuitry, to generate bit reliability values (BRVs) of code bits in each of the at least two codewords;
    aggregate BRVs of the static code bits in the static code section of each of the at least two codewords to generate aggregated BRVs, each aggregated BRV corresponding to a static code bit in the static code section of each of the at least two codewords; and
    decode, by the processing circuitry, the last one of the at least two codewords using the aggregated BRVs to recover the bit sequence of the information block corresponding to the last one of the at least two codewords.

14. The decoder of claim 13, wherein, the information block includes, in a static information section, static information bits that do not change for different transmission time intervals (TTIs) of the information block, and the static code bits in the static code section of each of the at least two codewords are generated from the static information bits of the information block through an encoding process.

15. The decoder of claim 13, wherein, the information block includes, in a static information section, static information bits that do not change for different TTIs of the information block, and semi-static information bits that do not change for at least two TTIs of the information block, and the static code bits in the static code section of each of the at least two codewords are generated from the static information bits or the semi-static information bits of the information block through an encoding process.

16. The decoder of claim 14, wherein the static information section of the information includes one or more significant bits (MSBs) of a data field of the information block.

17. The decoder of claim 13, wherein each BRV is a log likelihood ratio (LLR), that is a logarithm value of ratio of probability of a transmitted code bit being a first binary symbol to that of the transmitted code bit being another binary symbol.

18. The decoder of claim 13, wherein each of the at least two codewords is one of a block code, a convolutional code, a turbo code, or a low-density parity-check (LDPC) code.

19. The decoder of claim 13, wherein the at least two codewords are tail biting convolutional codes (TBCCs).

20. The decoder of claim 13, wherein the information block is a Master Information Block (MIB) specified in 3GPP LTE standards or 3GPP NB-IoT standards.

* * * * *